(12) United States Patent
Luo

(10) Patent No.: US 7,561,334 B2
(45) Date of Patent: Jul. 14, 2009

(54) METHOD AND APPARATUS FOR REDUCING BACK-GLASS DEFLECTION IN AN INTERFEROMETRIC MODULATOR DISPLAY DEVICE

(75) Inventor: Qi Luo, Cupertino, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 296 days.

(21) Appl. No.: 11/313,436

(22) Filed: Dec. 20, 2005

(65) Prior Publication Data
US 2007/0139655 A1   Jun. 21, 2007

(51) Int. Cl.
G02B 27/00   (2006.01)
G02F 26/00   (2006.01)

(52) U.S. Cl. .................. 359/577; 359/578; 359/224; 359/290; 359/291; 359/292; 359/295; 359/298; 345/85; 345/108; 348/744; 348/770; 348/771

(58) Field of Classification Search ................ 359/577, 359/578, 223, 224, 237–320; 345/55, 84–111; 348/744–774
See application file for complete search history.

(56) References Cited

U.S. PATENT DOCUMENTS

| | | |
|---|---|---|
| 3,704,806 A | 12/1972 | Plachenov et al. |
| 3,900,440 A | 8/1975 | Ohara et al. |
| 4,036,360 A | 7/1977 | Deffeyes |
| 4,074,480 A | 2/1978 | Burton |
| 4,431,691 A | 2/1984 | Greenlee |
| 4,531,126 A | 7/1985 | Sadones |
| 4,552,806 A | 11/1985 | Hayashi et al. |
| 4,950,344 A | 8/1990 | Glover et al. |
| 4,954,789 A | 9/1990 | Sampsell |
| 4,977,009 A | 12/1990 | Anderson et al. |
| 5,018,256 A | 5/1991 | Hornbeck |
| 5,075,796 A | 12/1991 | Schildkraut et al. |
| 5,091,983 A | 2/1992 | Lukosz |
| 5,095,375 A | 3/1992 | Bolt |
| 5,099,353 A | 3/1992 | Hornbeck |

(Continued)

FOREIGN PATENT DOCUMENTS

EP   1 093 162   4/2001

(Continued)

OTHER PUBLICATIONS

Jung et al., Soldered sealing process to assemble a protective cap for a MEMS CSP, Design, Test, Integration and Packaging of MEMS/MOEMS 2003 Symposium, pp. 255-260.

(Continued)

Primary Examiner—Evelyn A. Lester
(74) Attorney, Agent, or Firm—Knobbe Martens Olson & Bear LLP

(57) ABSTRACT

Methods and apparatus for reducing back-glass deflection in an interferometric modulator display device are provided. In one embodiment, an interferometric modulator display is provided that includes a including a substrate, an optical stack formed on the substrate, a moveable reflective layer formed over the optical stack, and a backplate attached to the substrate. The moveable reflective layer includes one or more first posts extending therefrom, in which one or more of the first posts are operable to protect the moveable reflective layer by contacting at least a portion of the backplate if the backplate is deflected.

27 Claims, 13 Drawing Sheets

U.S. PATENT DOCUMENTS

| | | |
|---|---|---|
| 5,172,262 A | 12/1992 | Hornbeck |
| 5,212,582 A | 5/1993 | Nelson |
| 5,216,537 A | 6/1993 | Hornbeck |
| 5,244,707 A | 9/1993 | Shores |
| 5,293,511 A | 3/1994 | Poradish et al. |
| 5,304,419 A | 4/1994 | Shores |
| 5,381,253 A | 1/1995 | Sharp et al. |
| 5,547,823 A | 8/1996 | Murasawa et al. |
| 5,550,373 A | 8/1996 | Cole et al. |
| 5,553,440 A | 9/1996 | Bulger et al. |
| 5,559,358 A | 9/1996 | Burns et al. |
| 5,591,379 A | 1/1997 | Shores |
| 5,646,729 A | 7/1997 | Koskinen et al. |
| 5,703,710 A | 12/1997 | Brinkman et al. |
| 5,739,945 A | 4/1998 | Tayebati |
| 5,815,141 A | 9/1998 | Phares |
| 5,835,255 A | 11/1998 | Miles |
| 5,853,662 A | 12/1998 | Watanabe |
| 5,939,785 A | 8/1999 | Klonis et al. |
| 5,986,796 A | 11/1999 | Miles |
| 6,040,937 A | 3/2000 | Miles |
| 6,055,090 A | 4/2000 | Miles |
| 6,238,755 B1 | 5/2001 | Harvey et al. |
| 6,355,328 B1 | 3/2002 | Baratuci et al. |
| 6,455,927 B1 | 9/2002 | Glenn et al. |
| 6,467,139 B1 | 10/2002 | Tanaka |
| 6,489,670 B1 | 12/2002 | Peterson et al. |
| 6,495,895 B1 | 12/2002 | Peterson et al. |
| 6,538,312 B1 | 3/2003 | Peterson et al. |
| 6,582,789 B1 | 6/2003 | Sumi |
| 6,589,625 B1 | 7/2003 | Kothari et al. |
| 6,603,182 B1 | 8/2003 | Low et al. |
| 6,621,134 B1 | 9/2003 | Zurn |
| 6,650,455 B2 | 11/2003 | Miles |
| 6,661,084 B1 | 12/2003 | Peterson et al. |
| 6,674,159 B1 | 1/2004 | Peterson et al. |
| 6,674,562 B1 | 1/2004 | Miles |
| 6,680,792 B2 | 1/2004 | Miles |
| 6,709,750 B1 | 3/2004 | Pohlmann et al. |
| 6,743,656 B2 | 6/2004 | Orcutt et al. |
| 6,791,660 B1 | 9/2004 | Hayashi et al. |
| 6,838,309 B1 | 1/2005 | McCann |
| 6,867,896 B2 | 3/2005 | Miles |
| 6,872,984 B1 | 3/2005 | Leung |
| 6,999,225 B2 | 2/2006 | Lin et al. |
| 7,012,726 B1 | 3/2006 | Miles |
| 7,012,732 B2 | 3/2006 | Miles |
| 7,015,885 B2 | 3/2006 | Novotny et al. |
| 7,034,984 B2 | 4/2006 | Pan et al. |
| 7,042,643 B2 | 5/2006 | Miles |
| 7,060,895 B2 | 6/2006 | Kothari et al. |
| 7,119,945 B2 | 10/2006 | Kothari et al. |
| 7,123,216 B1 | 10/2006 | Miles |
| 7,126,741 B2 | 10/2006 | Wagner et al. |
| 7,130,104 B2 | 10/2006 | Cummings |
| 7,136,213 B2 | 11/2006 | Chui |
| 7,138,984 B1 | 11/2006 | Miles |
| 7,142,346 B2 | 11/2006 | Chui et al. |
| 7,164,520 B2 | 1/2007 | Palmateer et al. |
| 7,259,449 B2 | 8/2007 | Floyd |
| 7,307,776 B2 | 12/2007 | Tsai et al. |
| 7,317,281 B2 | 1/2008 | Hayashi et al. |
| 7,385,748 B2 | 6/2008 | Miles |
| RE40,436 E | 7/2008 | Kothari et al. |
| 2002/0000649 A1 | 1/2002 | Tilmans et al. |
| 2002/0024711 A1 | 2/2002 | Miles |
| 2002/0056900 A1 | 5/2002 | Liu et al. |
| 2002/0075551 A1 | 6/2002 | Daneman |
| 2002/0075555 A1 | 6/2002 | Miles |
| 2002/0121909 A1 | 9/2002 | Sato et al. |
| 2002/0126364 A1 | 9/2002 | Miles |
| 2002/0160583 A1 | 10/2002 | Song |
| 2002/0187254 A1 | 12/2002 | Ghosh |
| 2003/0053233 A1 | 3/2003 | Felton |
| 2003/0054588 A1 | 3/2003 | Patel et al. |
| 2003/0062186 A1 | 4/2003 | Boroson et al. |
| 2003/0075794 A1 | 4/2003 | Felton et al. |
| 2003/0103185 A1 | 6/2003 | Kim et al. |
| 2003/0104651 A1 | 6/2003 | Kim et al. |
| 2003/0108306 A1 | 6/2003 | Whitney et al. |
| 2003/0155643 A1 | 8/2003 | Freidhoff |
| 2003/0183916 A1 | 10/2003 | Heck et al. |
| 2003/0184412 A1 | 10/2003 | Gorrell |
| 2003/0214007 A1 | 11/2003 | Tao et al. |
| 2004/0048037 A1 | 3/2004 | Klausmann et al. |
| 2004/0051929 A1 | 3/2004 | Sampsell et al. |
| 2004/0061492 A1 | 4/2004 | Lopes et al. |
| 2004/0066258 A1 | 4/2004 | Cohn et al. |
| 2004/0070706 A1 | 4/2004 | Freeman |
| 2004/0100677 A1 | 5/2004 | Huibers et al. |
| 2004/0140557 A1 | 7/2004 | Sun et al. |
| 2004/0184133 A1 | 9/2004 | Su et al. |
| 2005/0023976 A1 | 2/2005 | Wang |
| 2005/0036192 A1 | 2/2005 | Lin et al. |
| 2005/0042117 A1 | 2/2005 | Lin |
| 2005/0046919 A1 | 3/2005 | Taguchi et al. |
| 2005/0046922 A1 | 3/2005 | Lin et al. |
| 2005/0074919 A1 | 4/2005 | Patel et al. |
| 2005/0093134 A1 | 5/2005 | Tarn |
| 2005/0195462 A1 | 9/2005 | Lin |
| 2005/0253283 A1 | 11/2005 | Dcamp et al. |
| 2005/0254115 A1 | 11/2005 | Palmateer |
| 2006/0066935 A1 | 3/2006 | Cummings et al. |
| 2006/0076631 A1 | 4/2006 | Palmateer et al. |
| 2006/0076634 A1 | 4/2006 | Palmateer et al. |
| 2006/0076637 A1 | 4/2006 | Gally |
| 2006/0077126 A1 | 4/2006 | Kothari |
| 2006/0077145 A1 | 4/2006 | Floyd |
| 2006/0077503 A1 | 4/2006 | Palmateer et al. |
| 2006/0077527 A1* | 4/2006 | Cummings .................. 359/291 |
| 2006/0152106 A1 | 7/2006 | Yan et al. |
| 2006/0197215 A1 | 9/2006 | Potter |
| 2007/0064295 A1* | 3/2007 | Faase et al. ................. 359/245 |
| 2007/0242345 A1 | 10/2007 | Natarajan et al. |
| 2007/0297037 A1 | 12/2007 | Khonsari et al. |
| 2007/0298541 A1 | 12/2007 | Floyd |
| 2008/0038876 A1 | 2/2008 | Floyd |
| 2008/0112036 A1 | 5/2008 | Cummings |
| 2008/0180783 A1* | 7/2008 | Wang et al. ................. 359/291 |

FOREIGN PATENT DOCUMENTS

| | | |
|---|---|---|
| EP | 1 418 154 | 5/2004 |
| FR | 2841380 | 12/2003 |
| JP | 59-6842 | 1/1984 |
| JP | 04-085859 | 3/1992 |
| JP | 11-145337 | 5/1999 |
| WO | WO 01/45140 | 6/2001 |
| WO | WO 02/42716 A2 | 5/2002 |
| WO | WO 03/009318 | 1/2003 |
| WO | WO 03/026369 A1 | 3/2003 |
| WO | WO 03/105198 | 12/2003 |
| WO | WO 2004/025727 | 3/2004 |

OTHER PUBLICATIONS

Kim et al., Fabrication and characteriziation of a low-temperature hermetic MEMS package bonded by a closed loop AuSn solder-line, Proceedings of the IEEE 16th Annual International Conference on Micro Electro Mechanical Systems, Jan. 2003, pp. 614-617.

Liang, Zhi-Hao et al., "A Low Temperature Wafer-Level Hermetic MEMS Package Using UV Curable Adhesive", Electronic Components and Technology Conference, 2004 IEEE, pp. 1486-1491.

Maharbiz et al., Batch micropackaging by compression-bonded wafer-wafer transfer, Twelfth IEEE International Conference on Micro Electro Mechanical Systems, Jan. 17-21, 1999, pp. 482-489.

Moraja, et al., Advanced Getter Solutions at Wafer Level to Assure High Reliability to the last Generations MEMS, IEEE Reliability Physics Symposium Proceedings, 2003, pp. 458-459.

Sparks, et al. Chip-Level Vacuum Packaging of Micromachines Using NanoGetters, IEEE Transactions on Advanced Packaging, vol. 26 Issue 3, Aug. 2003, pp. 277-282.

Tao et al., Selective Bonding and encapsulation for wafer-level vacuum packaging of mems and related micro systems, Microelectronics and Reliability, 44(2):251-258, Feb. 2004.

Tilmans et al., The indent reflow sealing (IRS) technique-A method for the fabrication of sealed cavities for mems devices, Journal of Microelectromechanical Systems, 9(2), Jun. 2000.

Tominetti, et al., Moisture and impurities detection and removal in packaged MEMS, Proceedings of the SPIE, Reliability, Testing and Characterization of MEMS/MOEMS, Oct. 2001, pp. 215-225.

Yang et al., Localized induction heating solder bonding for wafer level MEMS packaging, 17th IEEE International Conference on Micro Electro Mechanical Systems, Jan. 2004, pp. 729-732.

ISR and WO for PCT/US06/048389, filed Dec. 19, 2006.

IPRP for PCT/US06/048389, filed Dec. 19, 2006.

* cited by examiner

|  | Column Output Signals | |
|---|---|---|
|  | +$V_{bias}$ | -$V_{bias}$ |
| Row Output Signals   0 | Stable | Stable |
| +ΔV | Relax | Actuate |
| −ΔV | Actuate | Relax |

METHOD AND APPARATUS FOR REDUCING BACK-GLASS DEFLECTION IN AN INTERFEROMETRIC MODULATOR DISPLAY DEVICE

FIELD OF THE INVENTION

The present invention relates generally to display devices, and more particularly to interferometric modulator display devices.

BACKGROUND OF THE INVENTION

Microelectromechanical systems (MEMS) include micromechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by a transparent medium (e.g., an air gap). As described herein in more detail, the position of one plate in relation to the other plate can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

Conventional interferometric modulator display devices typically include a recessed backplate. The recessed backplate generally serves two purposes. First, the recessed backplate protects the interferometric modulator—e.g., the pair of conductive plates. Second, the recessed area within the backplate provides space for desiccant to be deposited. The desiccant absorbs moisture within an interferometric modulator display device. As interferometric modulator display devices increase in size, the recessed backplate more easily deflects under external pressure (e.g., when the interferometric display device is handled by a user). Due to the deflection, the recessed backplate can touch the interferometric modulator which can lead to breakdown of the interferometric modulator display device.

Accordingly, what is needed is an improved design for an interferometric display device to reduce backplate deflection caused by external pressure applied to the interferometric display device. The present invention addresses such a need.

BRIEF SUMMARY OF THE INVENTION

In general, in one aspect, this specification describes an interferometric modulator display including a substrate, an optical stack formed on the substrate, a moveable reflective layer formed over the optical stack, and a backplate attached to the substrate. The moveable reflective layer includes one or more first posts extending therefrom, in which one or more of the first posts are operable to contact at least a portion of the backplate when the backplate is deflected to protect the moveable reflective layer.

Particular features can include one or more of the following features. The backplate can comprise a recessed backplate including a non-recessed island formed therein. The one or more first posts can protect the moveable reflective layer by contacting the non-recessed island if the recessed backplate is deflected. The non-recessed island can be formed substantially in the center of the recessed backplate. The interferometric modulator display can further comprise one or more second non-recessed islands formed within the backplate. The one or more first posts can protect the moveable reflective layer by contacting the one or more second non-recessed islands if the recessed backplate is deflected. A top surface of the non-recessed island can be substantially planar to an edge of the backplate that attaches to the substrate.

The optical stack can be patterned into parallel strips that form rows of the interferometric modulator display. The one or more first posts can extend from the optical stack between the rows of the interferometric modulator display. The moveable reflective layer can comprise columns that are orthogonal to the parallel strips of the optical stack. The one or more first posts can extend from the moveable reflective layer between the columns of the interferometric modulator display. The interferometric modulator display can further comprise one or more second posts to support the columns of the reflective layer. The one or more first posts can extend from the moveable reflective layer beyond the one or more second posts. The interferometric modulator can further comprise desiccant dispensed on the backplate around the non-recessed island, in which the desiccant absorbs moisture within the interferometric modulator display. The one or more first posts can have a circular cross-section or a non-circular cross-section. The interferometric modulator display can further comprise a processor that is in electrical communication with the interferometric modulator display, and a memory device in electrical communication with the processor. The processor can be configured to process image data.

The interferometric modulator display can further comprise a first controller configured to send at least one signal to the interferometric modulator display, and a second controller configured to send at least a portion of the image data to the first controller. The interferometric modulator display can further comprise an image source module configured to send the image data to the processor. The image source module can comprise at least one of a receiver, transceiver, and transmitter. The interferometric modulator display can further comprise an input device configured to receive input data and to communicate the input data to the processor.

In general in another aspect, this specification describes an interferometric modulator display including a substrate means, an optical stack means formed on the substrate means, a moveable reflective layer means formed over the optical stack means, and a recessed backplate means attached to the substrate means. The moveable reflective layer means includes one or more first post means extending therefrom. The recessed backplate means includes a non-recessed island means formed therein. The one or more first post means are operable to protect the moveable reflective layer means by contacting the non-recessed island means if the recessed backplate means is deflected.

In general in another aspect, this specification describes a method of manufacturing an interferometric modulator display device, the method includes, providing a substrate, forming an optical stack on the substrate, forming a moveable reflective layer over the optical stack, and attaching a recessed backplate to the substrate. The moveable reflective layer includes one or more first posts extending therefrom. The recessed backplate including a non-recessed island formed. The one or more first posts are operable to protect the moveable reflective layer by contacting the non-recessed island if the recessed backplate is deflected.

Implementations may provide one or more of the following advantages. Methods are provided to form one or more posts (or spacers/dams) within an interferometric modulator display device, which posts can reduce the deflection of a backplate of the interferometric display device. Accordingly, a thinner backplate can, therefore, be used to, for example, reduce weight of a (packaged) device including an interferometric modulator display. Formation of the posts can be integrated into the front-end process of fabrication of the interferometric display device and, therefore, conventional fabrication processes can be used to form the posts.

The details of one or more implementations are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF THE INVENTION

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

As discussed above, conventional interferometric modulator display devices typically include a recessed backplate. As interferometric modulator display devices increase in size, the recessed backplate more easily deflects under external pressure (e.g., when the interferometric display device is handled by a user). Due to the deflection, the recessed backplate can touch the interferometric modulator which can lead to breakdown of the interferometric modulator display device. Accordingly, this specification describes an improved design for an interferometric display device to reduce backplate deflection caused by external pressure applied to the interferometric display device. In one embodiment, an interferometric modulator display is provided that includes a transparent substrate, and an optical stack formed on the transparent substrate. The optical stack includes one or more first posts extending therefrom. The interferometric modulator display further includes a recessed backplate attached to the transparent substrate, in which the recessed backplate includes a non-recessed island formed therein. The one or more first posts are operable to contact the non-recessed island when the recessed backplate is deflected to protect the optical stack.

Figure 1:
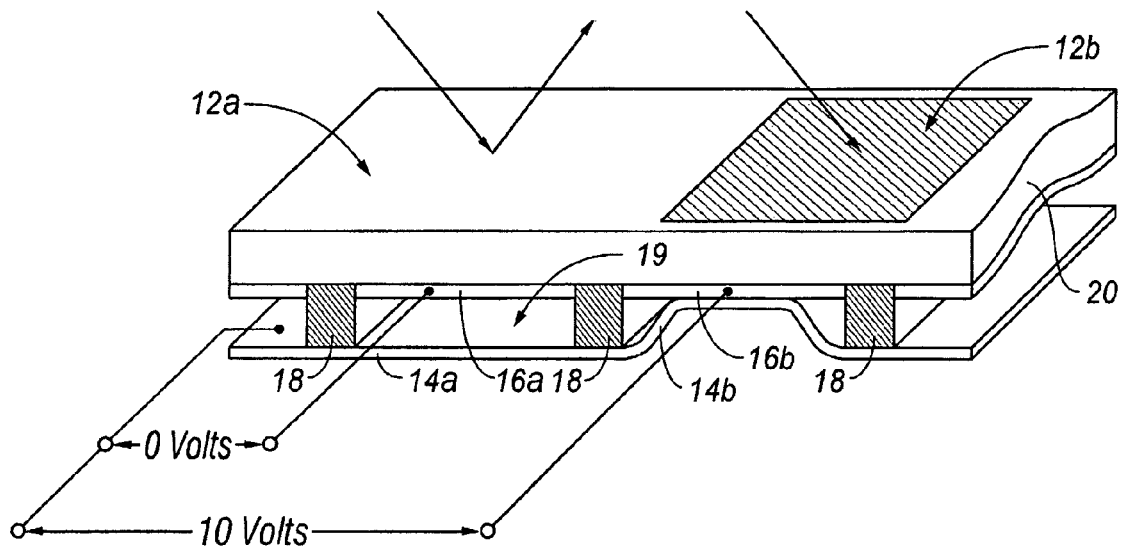
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the fixed partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not shown) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
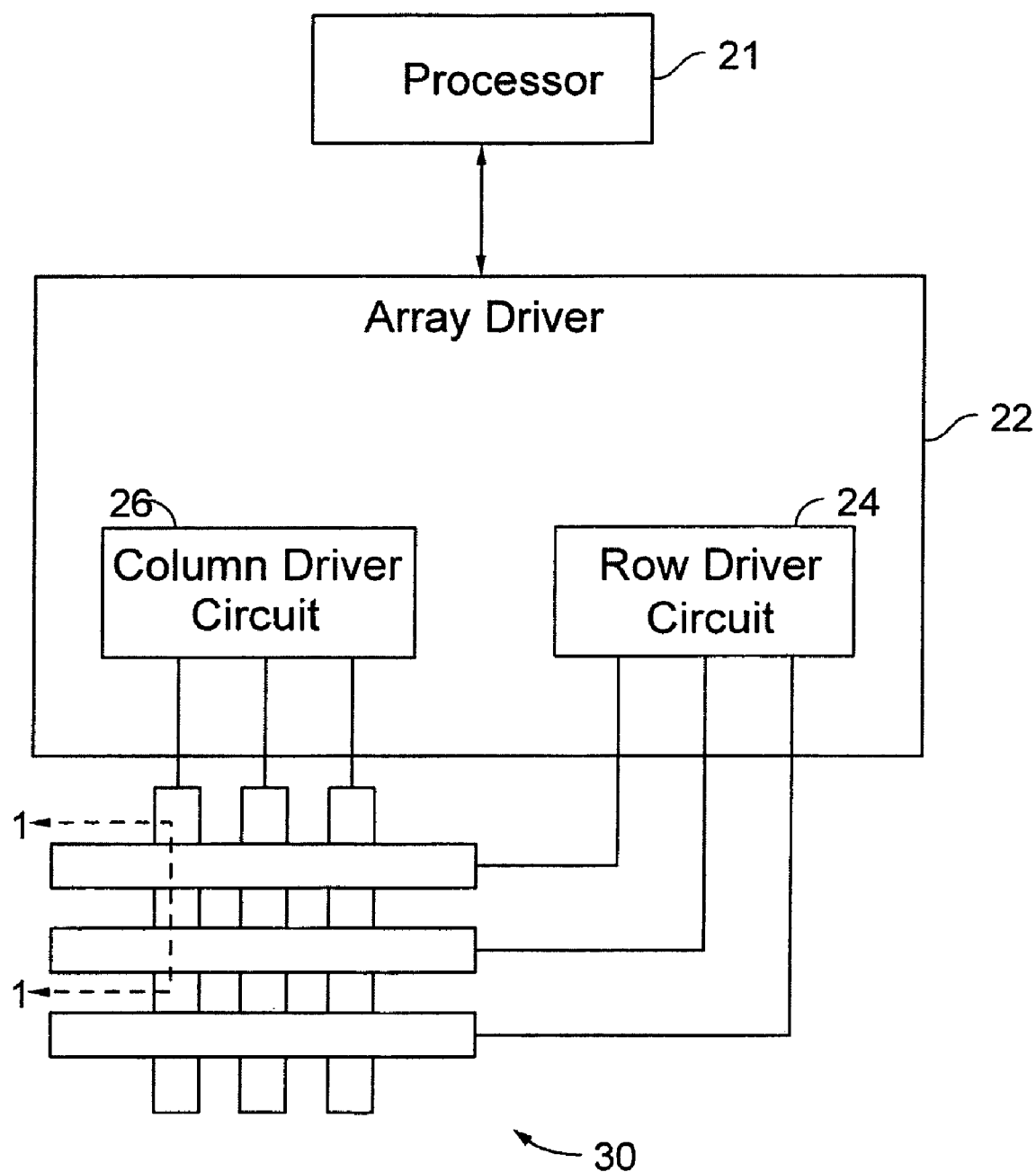
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single-chip or multi-chip microprocessor such as an ARM (Advanced RISC Machine), Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 0 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window."

Figures 3, 4:
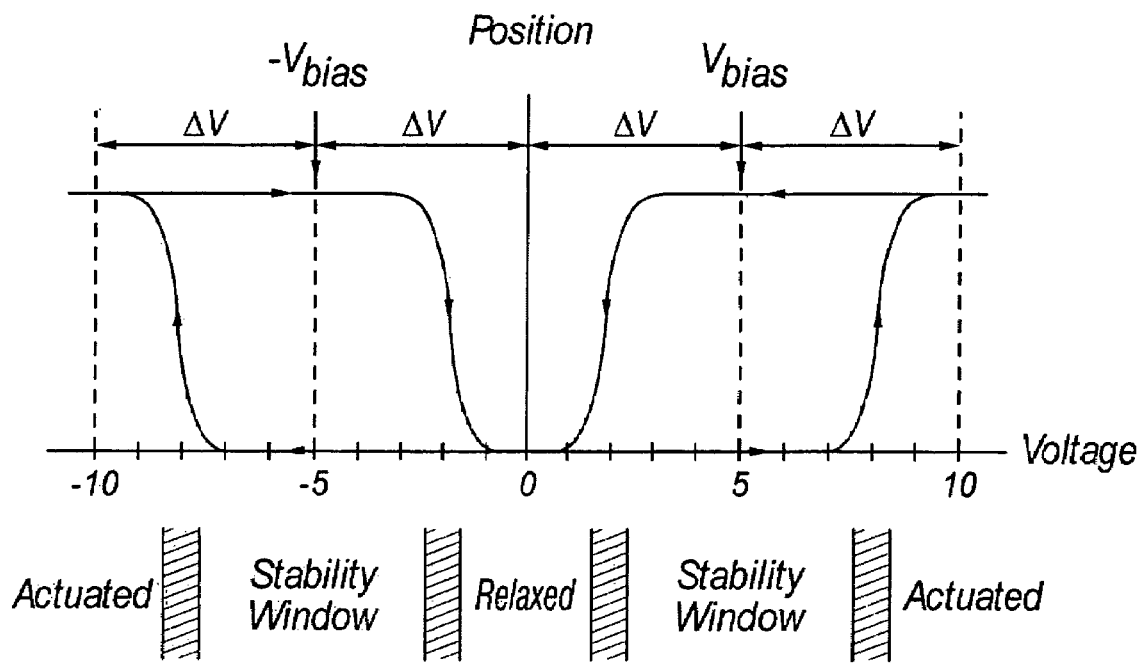
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figure 5A:
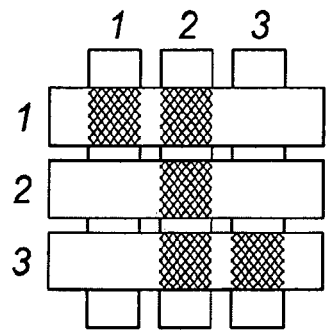
FIGS. 5A-5B illustrate one exemplary timing diagram for row and column signals that may be used to write a frame of display data to the 3×3 interferometric modulator display of FIG. 2.
Figure 5B:
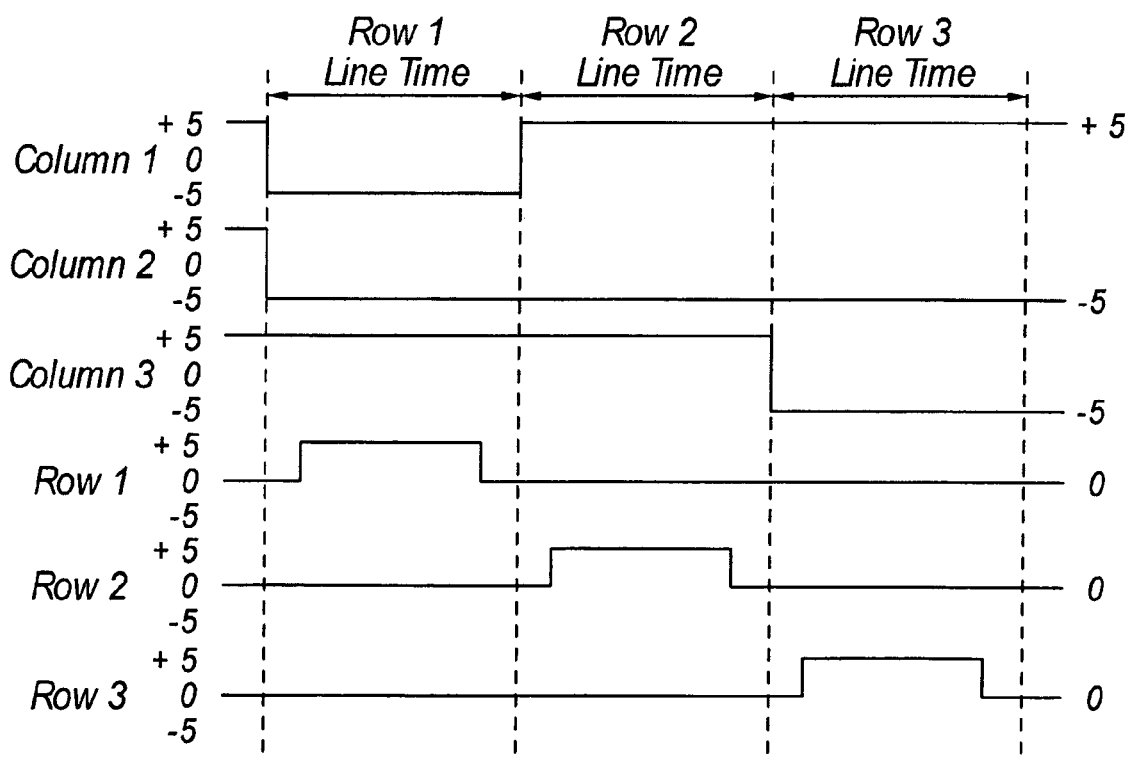

FIGS. 4 and 5A-5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the embodiment shown in FIG. 4, actuating a pixel involves setting the appropriate column to $-V_{bias}$, and the appropriate row to $+\Delta V$, which may correspond to −5 volts and +5 volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the frame shown in FIG. 5A, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

The details of the structure of interferometric modulators that operate in accordance with the principles set forth above may vary widely. For example, FIGS. 6A-6E illustrate five different embodiments of the movable reflective layer 14 and corresponding supporting structures.

Figure 6A:
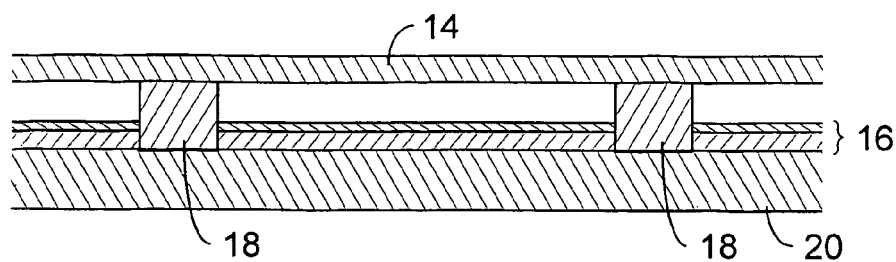
FIG. 6A is a cross section of an interferometric modulator of FIG. 1.
Figure 6B:
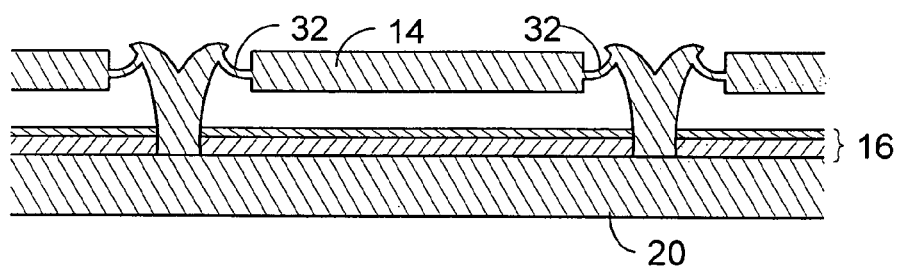
FIGS. 6B-E are alternative embodiments of an interferometric modulator.
Figure 6C:
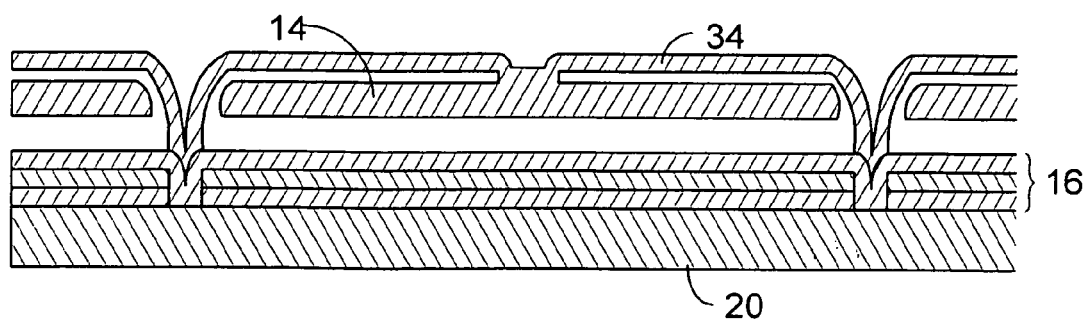
Figure 6D:
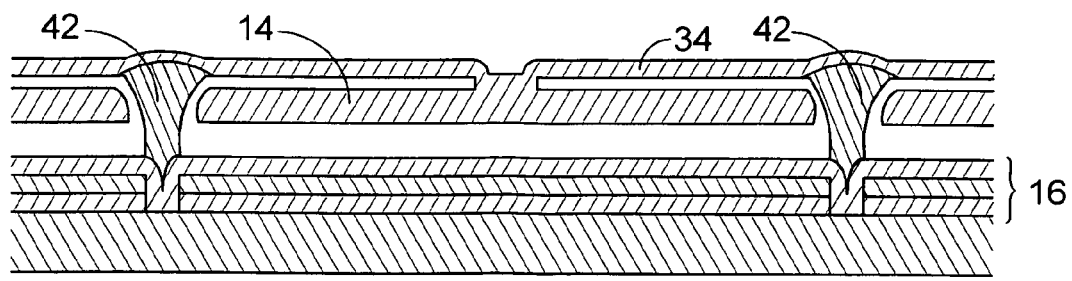
Figure 6E:
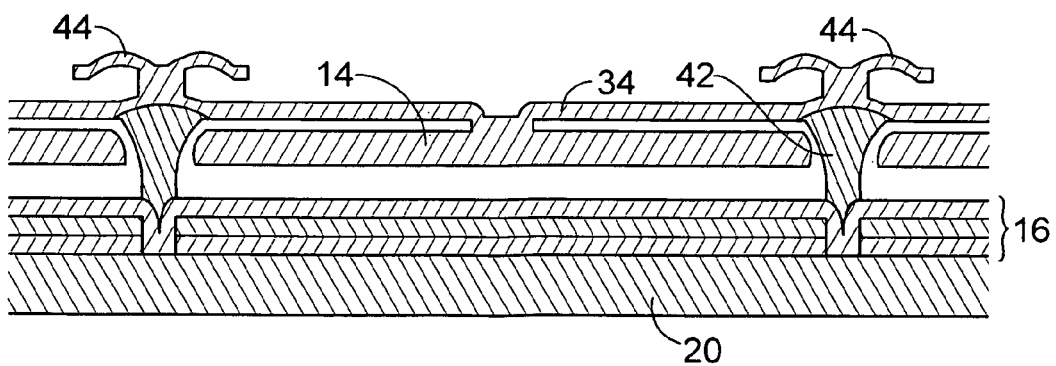

FIG. 6A is a cross section of the embodiment of FIG. 1, where a strip of metal material 14 is deposited on orthogonally extending supports 18. In FIG. 6B, the moveable reflective layer 14 is attached to supports at the corners only, on tethers 32. In FIG. 6C, the moveable reflective layer 14 is suspended from a deformable layer 34, which may comprise a flexible metal. The deformable layer 34 connects, directly or indirectly, to the substrate 20 around the perimeter of the deformable layer 34. These connections are referred to herein as support posts. The embodiment illustrated in FIG. 6D has support post plugs 42 upon which the deformable layer 34 rests. The movable reflective layer 14 remains suspended over the cavity, as in FIGS. 6A-6C, but the deformable layer 34 does not form the support posts by filling holes between the deformable layer 34 and the optical stack 16. Rather, the support posts are formed of a planarization material, which is used to form support post plugs 42. The embodiment illustrated in FIG. 6E is based on the embodiment shown in FIG. 6D, but may also be adapted to work with any of the embodiments illustrated in FIGS. 6A-6C as well as additional embodiments not shown. In the embodiment shown in FIG. 6E, an extra layer of metal or other conductive material has been used to form a bus structure 44. This allows signal routing along the back of the interferometric modulators, eliminating a number of electrodes that may otherwise have had to be formed on the substrate 20.

Figure 7A:
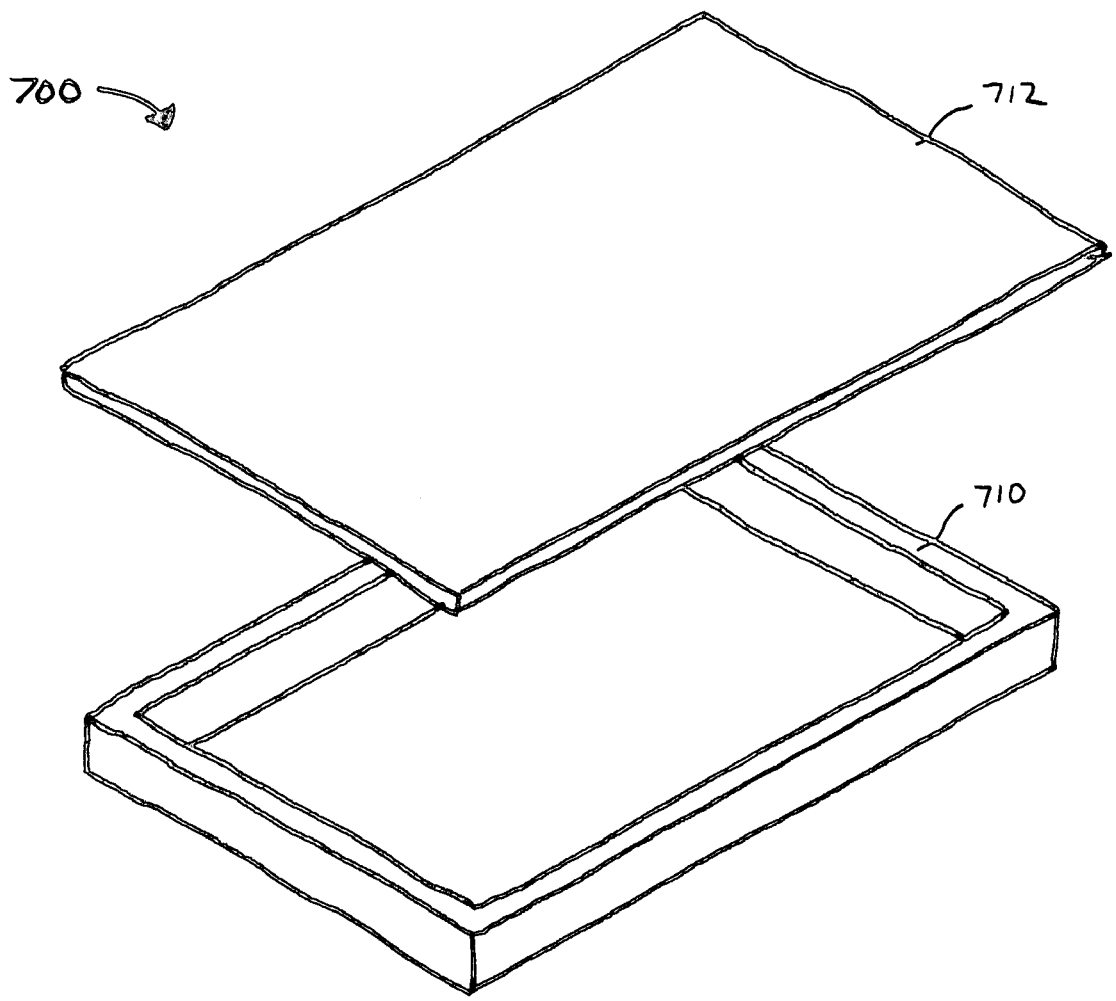
FIGS. 7A-7B illustrate an exploded view and a cross-sectional view, respectively, of a packaged device including an interferometric modulator array according to one embodiment.
Figure 7A:
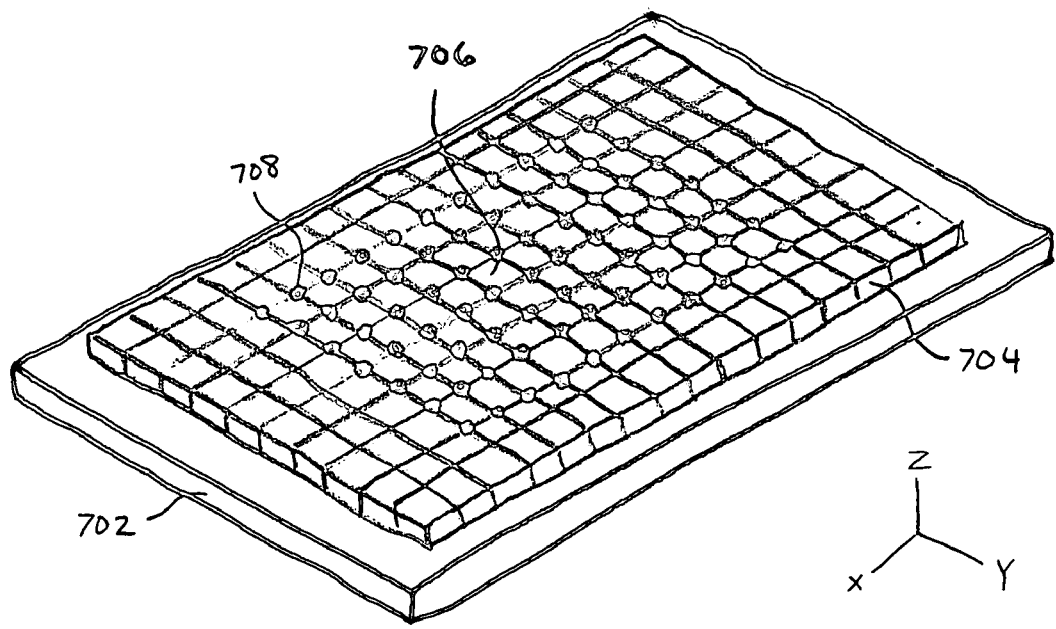
Figure 7B:
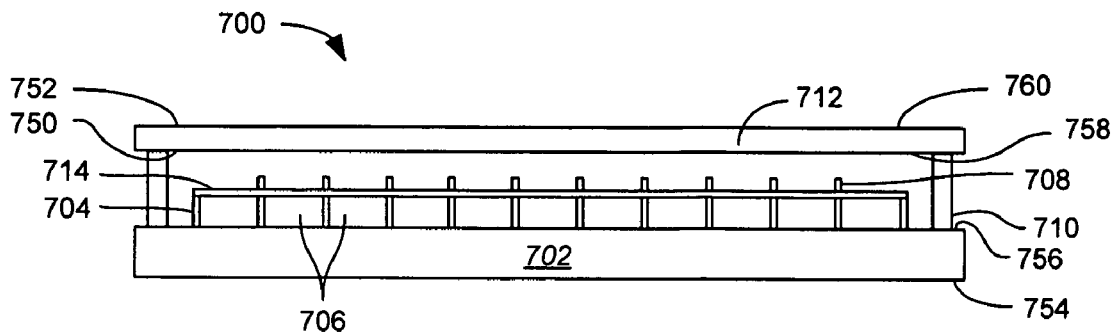

FIG. 7A and FIG. 7B respectively illustrate an exploded view and cross-section of an embodiment of a packaged electronic device 700 comprising a substrate 702, an array 704 of interferometric modulators 706, one or more posts 708, a seal 710, and a backplate 712. As best seen in FIG. 7B, the device 700 includes a first side 750 and a second side 752. The substrate 702 includes a first surface 754 and a second surface 756. On the second surface 756 of the substrate 702 is formed the interferometric modulator array 704. As shown in FIG. 7B, the backplate 712 is secured to the substrate 702 by the seal 710. Referring to both FIGS. 7A-7B, also shown are one or more posts 708 that extend from the interferometric modulator array 704. In one implementation, one or more of the posts 708 prevent the backplate 712 from touching the interferometric modulator array 704 when the backplate 712 is deformed due to, for example, deflection under external pressure. Also illustrated in FIGS. 7A-7B are x, y, and z axes referred to in the description below.

Figure 7C:
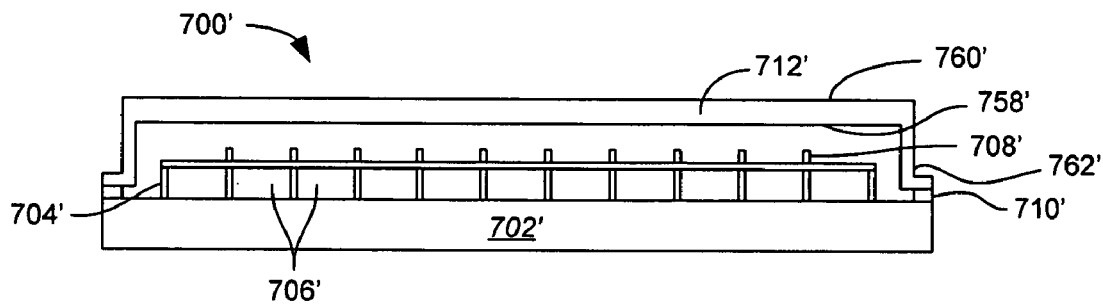
FIGS. 7C-7D illustrate a cross-sectional view of a packaged device including a recessed backplate according to two different embodiments.
Figure 7D:
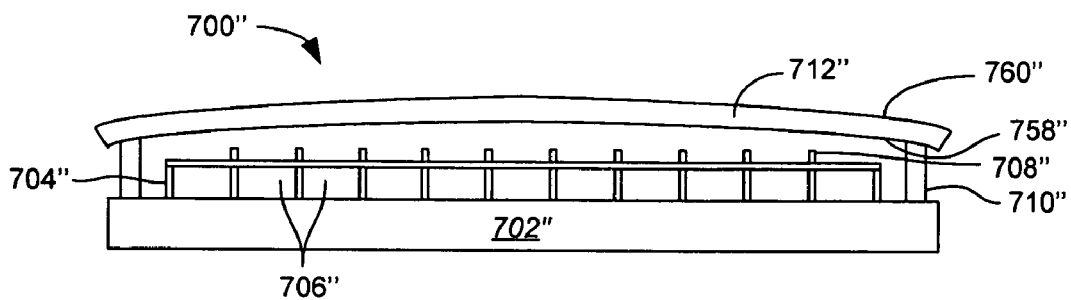
Figure 7E:
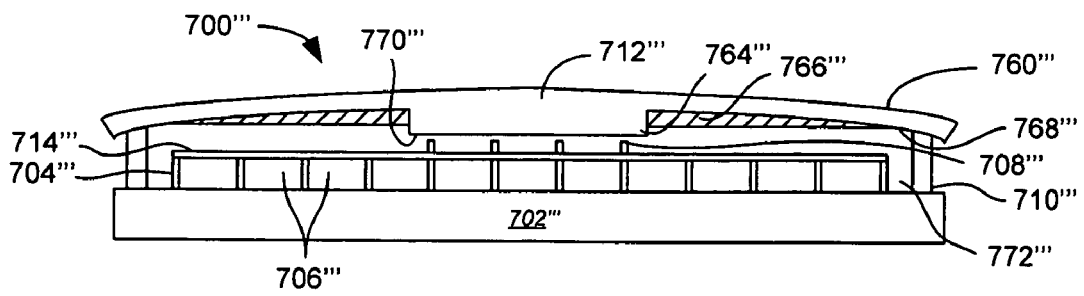
FIG. 7E illustrates a cross-sectional view of a packaged device including a recessed backplate having a non-recessed island according to one embodiment.
Figure 8:
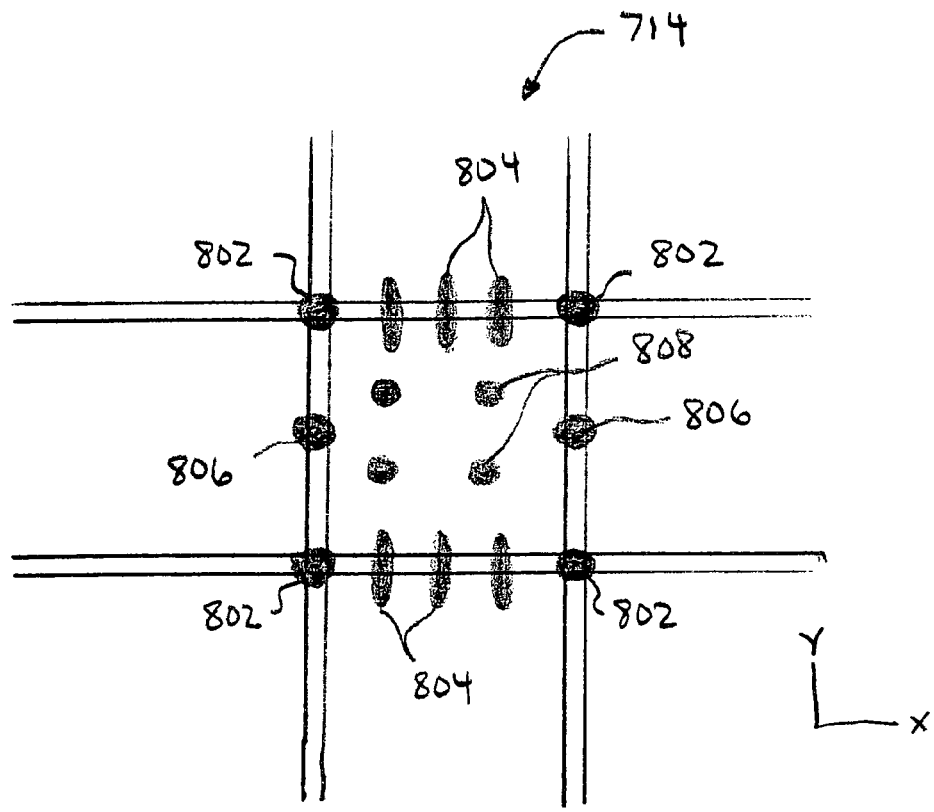
FIG. 8 illustrates an interferometric modulator in the packaged device of FIG. 7A according to one embodiment.

FIG. 8 shows an exploded view of one or more posts extending from the interferometric modulator 706 (in the interferometric modulator array 704 of FIG. 7) according to one embodiment. One or more posts can similarly extend from other interferometric modulators of the interferometric modulator array 704, as shown with interferometric modulator 706. As shown in FIG. 8, one or more posts can extend from the interferometric modulator 706 in between both rows and columns of the interferometric modulator array 704 as represented by posts 802. One or more posts can also extend from the interferometric modulator 706 along the rows or columns of the interferometric modulator array 704 as represented, respectively, by posts 804 and posts 806. Additionally, one or more posts can extend from the interferometric modulator 706 in between both rows and columns of the interferometric modulator array 704 as represented by posts 808. As shown in FIG. 8, one or more of the posts can have a substantially circular cross-section (e.g., as represented by posts 802), or have substantially an oval-shaped cross-section (e.g., as represented by posts 804). Although not illustrated in the Figures, in another embodiment a cross-section of the posts is non-circular and may be any other shape.

Referring back to FIGS. 7A-7B, the substrate 702 and the interferometric modulators 706 are described in greater detail above. Briefly, the substrate 702 is any substrate on which an interferometric modulator 706 is formable. In some embodiments, the device 700 displays an image viewable from the first side 750, and accordingly, the substrate 702 is substantially transparent and/or translucent. For example, in some embodiments, the substrate is glass, silica, and/or alumina. In other embodiments, the substrate 702 is not substantially transparent and/or translucent, for example, in a device 700 that displays an image viewable from the second side 752, or in a device 700 that does not display a viewable image. In some embodiments, the first surface 754 of the substrate further comprises one or more additional structures, for example, one or more structural, protective, and/or optical films.

The interferometric modulators 706 are of any type. In some embodiments, each of the interferometric modulators 706 comprises a mechanical layer 714 distal from the substrate 702 and proximal to the backplate 712. In one embodiment, one or more of the posts 708 are operable to protect the mechanical layer 714 from damage due to, for example, deflection of the backplate 712 from external pressure or some internally-created stress.

In the embodiment illustrated in FIGS. 7A-7B, the seal 740 secures the backplate 712 to the substrate 702. In one embodiment, the seal 740 also acts to maintain a pre-determined spacing between the backplate 712 and the substrate 702. In the embodiment illustrated in FIG. 7C, the seal 710' does not have a spacing function. In some embodiments, the seal does not produce or outgas a volatile compound, for example, hydrocarbons, acids, amines, and the like. In some embodiments, the seal is partially or substantially impermeable to liquid water and/or water vapor. In some embodiments, the seal is partially or substantially impermeable to air and/or other gases. In some embodiments, the seal is rigid. In other embodiments, the seal is elastic or elastomeric. In other embodiments, the seal comprises both rigid, and elastic or elastomeric components. In some embodiments, the seal comprises one or more adhesives compatible with the substrate and/or backplate. The adhesive or adhesives are of any suitable type known in the art. In some embodiments, one or more of the adhesives is pressure sensitive. In some embodiments, one or more of the adhesives is thermally cured. In some embodiments, one or more of the adhesives is UV-cured. In some embodiments, the seal is thermally bonded to the substrate and/or backplate. In some embodiments, the seal is secured to the substrate and/or backplate mechanically. Some embodiments use a combination of methods for securing the seal to the substrate and/or backplate. Some embodiments do not comprise a seal, for example, where the substrate is secured directly to the backplate, for example, by thermal welding.

The seal comprises any suitable material, for example, metals, steel, stainless steel, brass, titanium, magnesium, aluminum, copper, tin, lead, zinc, solder, polymer resins, epoxies, polyamides, polyalkenes, polyesters, polysulfones, polystyrene, polyurethanes, polyacrylates, cyanoacrylates, acrylic epoxies, silicones, rubbers, polyisobutylene, neoprene, polyisoprene, styrene-butadiene, parylene, UV-curable adhesives, ceramics, glass, silica, alumina, and blends, copolymers, alloys, and/or composites thereof. In some embodiments, the seal further comprises a reinforcement, for example, fibers, a mesh, and/or a fabric, for example, glass, metal, carbon, boron, carbon nanotubes, and the like. In some embodiments, the selected seal material is partially or substantially water impermeable. Accordingly, in some embodiments, the seal is a semi-hermetic or hermetic seal. In some embodiments, the seal is less than about 50 μm thick, for example, from about 10 μm to about 30 μm thick. In some embodiments, the seal is from about 0.5 mm to about 5 mm wide, for example, from about 1 mm to about 2 mm.

Returning to FIGS. 7A-7B, one embodiment of a method for fabricating the illustrated seal 710 using a UV-curable epoxy is described below. The epoxy is applied to the backplate 712 and/or substrate 702 using conventional techniques, for example, by printing. The type and amount of epoxy can be pre-selected to provide a seal with the desired width, thickness, and moisture permeation properties. The backplate 712 and substrate 702 are brought together, and the epoxy cured by irradiation with a suitable source of UV radiation. A typical epoxy is cured using about 6000 mJ/cm$^2$ of UV radiation. Some embodiments also include a post-cure bake at about 80° C.

In some embodiments, the backplate 712 protects the interferometric modulator array 704 from damage that can be caused by environmental conditions, for example, humidity, moisture, dust, changes in ambient pressure, and the like. Consequently, in some embodiments, the backplate 712 protects the interferometric modulator array 704 from contact with foreign objects and/or other components in an apparatus comprising the interferometric modulator array 704.

In embodiments in which the device 700 displays an image viewable from the second side 752, the backplate 712 is substantially transparent and/or translucent. In other embodiments, the backplate 712 is not substantially transparent and/or translucent. In some embodiments, the backplate 712 is made from a material that does not produce or outgas a volatile compound, for example, hydrocarbons, acids, amines, and the like. In some embodiments, the backplate 712 is substantially impermeable to liquid water and/or water vapor. In some embodiments, the backplate 712 is substantially rigid. In other embodiments, the backplate 712 is flexible, for example, foil or film. In some embodiments, the backplate 712 is deformed in a pre-determined configuration before and/or during assembly of the package structure 700. In some embodiments, the backplate 712 is substantially impermeable to air and/or other gases. Suitable materials for the backplate 712 include, for example, metals, steel, stainless steel, brass, titanium, magnesium, aluminum, polymer resins, epoxies, polyamides, polyalkenes, polyesters, polysulfones, polystyrene, polyurethanes, polyacrylates, parylene, ceramics, glass, silica, alumina, and blends, copolymers, alloys, composites, and/or combinations thereof. Examples of suitable composite materials include composite films available from Vitex Systems (San Jose, Calif.). In some embodiments, the backplate 712 further comprises a reinforcement, for example, fibers and/or a fabric, for example, glass, metal, carbon, boron, carbon nanotubes, and the like.

Referring to FIG. 7B, the backplate 712 comprises an inner surface 758 and an outer surface 760. In some embodiments, the inner surface and/or outer surface of the backplate further comprise one or more additional structures, for example, a structural, protective, mechanical, and/or optical film or films (not shown). In the embodiment illustrated in FIG. 7B, the backplate 712 is substantially planar. FIG. 7C illustrates an embodiment of a device 700' in which the inner surface 758' of the backplate 712' is recessed, thereby forming a flange 762' at the perimeter of the backplate 712'. A backplate having one or more recesses will be referred to as a "recessed backplate" herein.

FIG. 7D illustrates a cross section of a package device 700" comprising another embodiment of a recessed backplate 712" having a curved or bowed shape. In one embodiment, the curved shape of the recessed backplate 712" is formed by bending or deforming a substantially flat precursor during assembly of the package device 700". For example, in some embodiments, an array of interferometric modulators 704" is formed on a substrate 702" as described above. A seal material (e.g., a UV-curable epoxy) is applied to the periphery of a substantially planar backplate 712", which is wider and/or longer than the substrate 702". The backplate 712" is deformed, for example, by compression to the desired size and positioned on the substrate 702". The epoxy is cured, for example, using UV radiation to form the seal 710".

Figure 9:
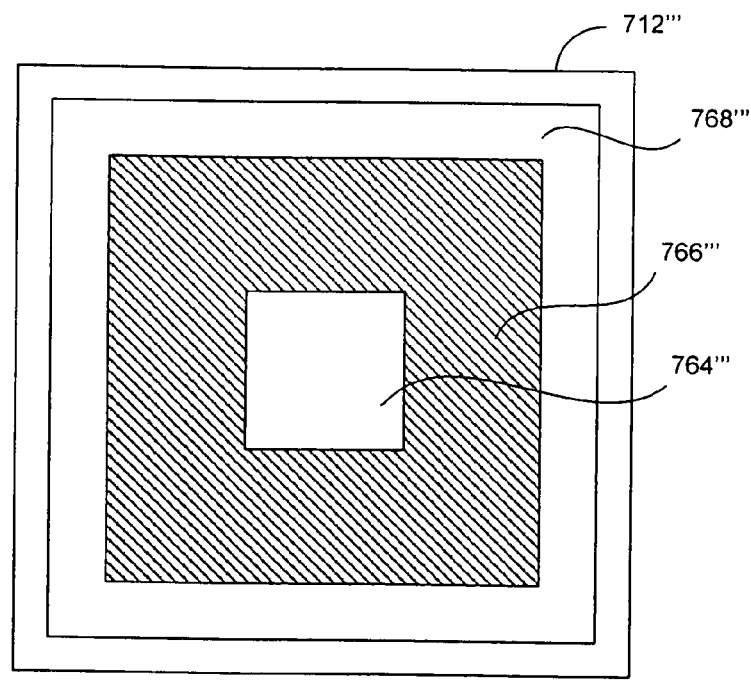
FIG. 9 illustrates a view of the inner surface of the recessed backplate of FIG. 7E according to one embodiment.

FIG. 7E illustrates a cross section of a package device 700''' comprising another embodiment of a recessed backplate 712''' including a non-recessed islands 764'''. Although the recessed backplate 712''' is shown as including a single non-recessed island, the recessed backplate 712''' can have any number of non-recessed islands. In one embodiment, one or more of the posts 708''' are operable to contact the non-recessed island 764''' when the recessed backplate 712''' is deflected to protect the mechanical layer 714''' (or the optical stack) formed on the substrate 702'''. In one embodiment, a desiccant 766''' is disposed in a cavity 768''' of the recessed backplate 712''' that surrounds the non-recessed island 764'''. In the embodiment illustrated in FIG. 7E, the desiccant 766''' substantially does not extend past an inner surface 770''' of the recessed backplate 712'''. FIG. 9 shows a top-down view of the inner surface of the recessed backplate 712'''. As shown in the embodiment of FIG. 9, the non-recessed island 764''' is formed substantially in the center of the recessed backplate 712'''. The non-recessed island 764" can be formed at locations other than the center of the recessed backplate 712'''. In addition, the non-recessed island can have a cavity formed therein (not shown). In one embodiment, the cavity formed within the non-recessed island contains desiccant.

Referring back to FIG. 7E, the dimensions of the cavity 768''' can be selected according for factors known in the art, for example, the properties of the desiccant, the quantity of desiccant to be used, the amount of moisture to be absorbed, the volume of the device, the mechanical properties of the backplate, and the like. Suitable desiccants and methods for securing a desiccant to a backplate are discussed in greater detail below. Those skilled in the art will appreciate that in other embodiments, the cavity 768''' (or cavities) can have a different configuration, for example, length, width, thickness, and/or shape. The cavity 768''' can be fabricated using conventional techniques—e.g., etching, embossing, stamping, engraving, machining, grinding, milling, sandblasting, molding, slumping, and the like. In some embodiments, recesses (or cavities) are created by building up the non-recessed portions (e.g., the non-recessed island 764''') of the recessed backplate 712''', for example, using an adhesive, welding, fusing, sintering, and the like. For example, in some embodiments, a slurry of glass is sprayed onto or molded on the backplate and the slurry fused or sintered to form a cavity.

In general, the desiccant 766''' maintains a reduced humidity within the enclosed space 772''' of the packaged device 700'''. In some embodiments, a package of desiccant is secured to an inner surface of the backplate, for example, using an adhesive, thermally, and/or mechanically. Suitable packaging into which a desiccant is suitably held are known in the art, including, e.g., a container with a mesh surface, a perforated container, a bag made from a permeable fabric or cover stock, and the like. In other embodiments, the package of desiccant comprises a sheet of a suitable material secured to the backplate, for example, using a pressure-sensitive adhesive. In some embodiments, the package of desiccant is non-dusting—i.e., resists releasing dust. In some embodiments, the desiccant is embedded in an inert carrier, for example, a polymer resin, and the assembly secured to the inner surface of the backplate. In some embodiments, the desiccant is directly secured to the inner surface of the backplate. In some embodiments, the material from which the backplate is fabricated comprises a desiccant. In some embodiments, the backplate comprises a layer of applied desiccant. For example, in some embodiments, a liquid desiccant or a desiccant dissolved or suspended in a suitable liquid is applied to the backplate and baked, thereby forming a layer of desiccant on the backplate. In other embodiments, a desiccant is mixed with an uncured polymer resin and the mixture applied to the backplate and cured.

The desiccant can be any suitable desiccant known in the art, for example, metal oxides, calcium oxide, barium oxide, boric anhydride, phosphorus pentoxide, metal sulfates, calcium sulfate, magnesium sulfate, sodium sulfate, metals, sodium, lead/sodium alloy, metal hydrides, sodium borohydride, sodium hydride, lithium aluminum hydride, silica gel, activated alumina, zeolites, molecular sieves, phosphorus, metal salts, magnesium perchlorate, zinc chloride, carbon nanotubes, and combinations thereof.

Returning to FIG. 7A and FIG. 7B, and as discussed above, in some embodiments, the packaged device 700 can deform due to, for example, application of an external force. Those skilled in the art will recognize that, in some embodiments, the deformation will result in relative or differential movement between the interferometric modulator array 704 and the backplate 712. In some embodiments, forces likely to be encountered during the normal use of the packaged device 700—e.g., during the construction of the packaged device 700, during the installation of the packaged device 700 in an apparatus, or during the normal use of the packaged device 700—are insufficient to cause the interferometric modulator array 704 to contact the backplate 712. As discussed above, some components of an interferometric modulator 706, for example, the mechanical layer 714 (or optical stack), are susceptible to damage on physical contact. Consequently, in these embodiments, the one or more of the posts 708 are operable to contact at least a portion of the backplate 712, e.g., when the backplate 712 is deformed due to an external force, thereby preventing the backplate 712 from contacting the mechanical layer 704.

Figure 10:
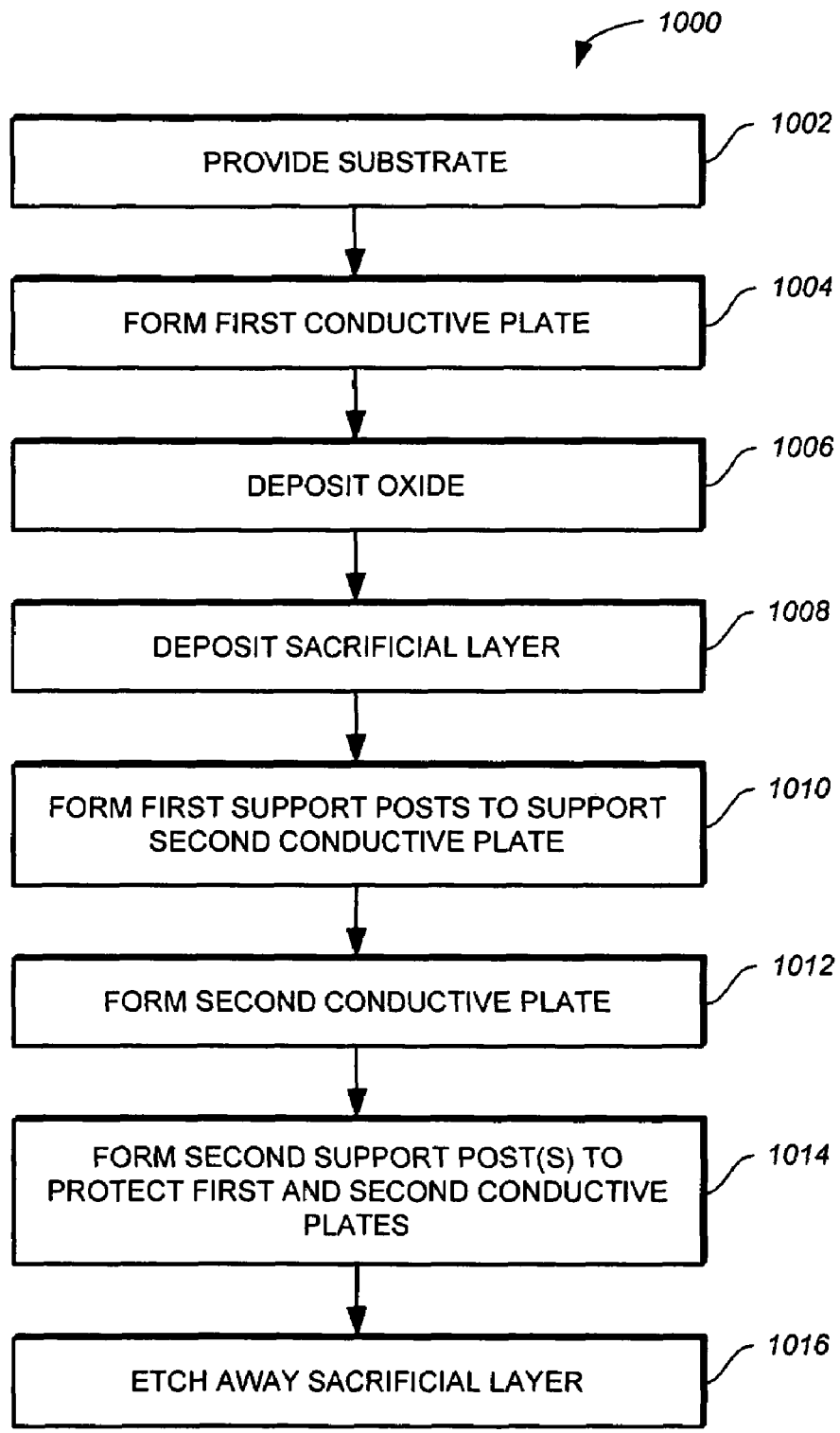
FIG. 10 illustrates a flow diagram illustrating a process for manufacturing a packaged device including an interferometric modulator array according to one embodiment.

FIG. 10 illustrates a process 1000 of fabricating an interferometric modulator (e.g., interferometric modulator 706) including one or more posts.

Figure 11A:
FIGS. 11A-11H illustrate the process of manufacturing a packaged device including an interferometric modulator according to the process of FIG. 10.
Figure 11B:
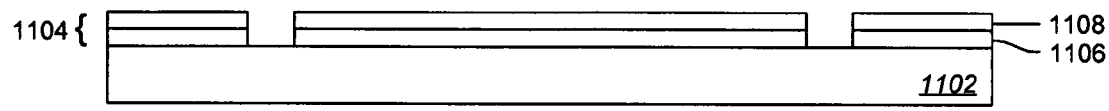
Figure 11C:
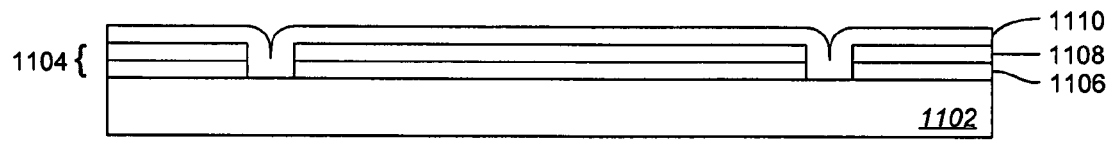
Figure 11D:
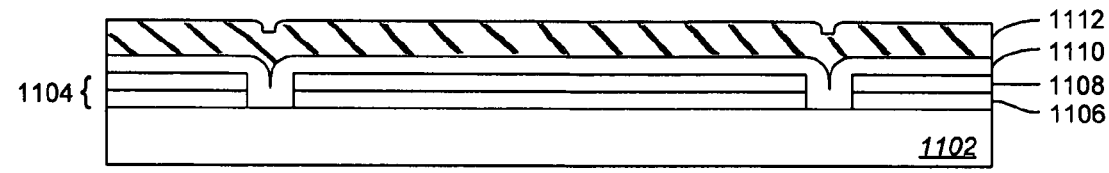

The process 1000 begins with providing a substrate (step 1002). Referring to the example of FIG. 11A, a substrate 1102 is provided. As discussed above, the substrate 1102 can be transparent or not transparent. In one embodiment, the substrate 1102 comprises glass. A first conductive plate is formed (step 1004). As shown in FIG. 11B, a first conductive plate 1104 is formed, in which the first conductive plate comprises a conductive layer 1106 and a partially reflective layer 1108. In one embodiment, the conductive layer 1106 comprises indium tin oxide (ITO) and the partially reflective layer comprises chromium. The first conductive plate can include one or more additional layers (not shown) and/or films. An oxide layer is deposited (step 1006). As shown in FIG. 11C, an oxide layer 1110 is deposited over the partially reflective layer 1108. In one embodiment, the oxide layer 1110 comprises a silicon oxide compound ($Si_xO_y$). A sacrificial layer is deposited (step 1008). Referring to FIG. 11D, a sacrificial layer 1112 is deposited over the oxide layer 1110. In one embodiment, the sacrificial layer comprises molybdenum. In one embodiment, the height of the sacrificial layer 1112 determines the amount of spacing between the first conductive plate 1104 and a second conductive plate (discussed below).

Figure 11E:
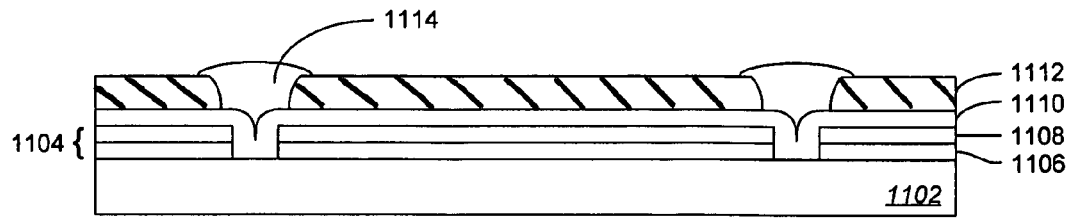

A plurality of first support posts are formed (step 1010). As shown in FIG. 11E, first support posts 1114 are formed through the sacrificial layer 1112. In one embodiment, the first support posts 1114 comprise a silicon oxide compound. In one embodiment, the first support posts are formed by etching (or removing) portions of the sacrificial layer 1112 at pre-determined locations (where support posts are desired) using a mask, and depositing the silicon oxide compound over the sacrificial layer 1112. Portions of the silicon oxide compound that are not located within the pre-determined locations are then removed through a photoresist process, thus leaving the first support posts 1114 at the pre-determined locations. A second conductive plate is formed (step 1012). Referring to the example of FIG. 11F, a second conductive plate 1116 is formed over the first posts 1114 and the sacrificial layer 1112. In one embodiment, the second conductive plate 1116 comprises a movable reflective layer as discussed above.

Figure 11F:
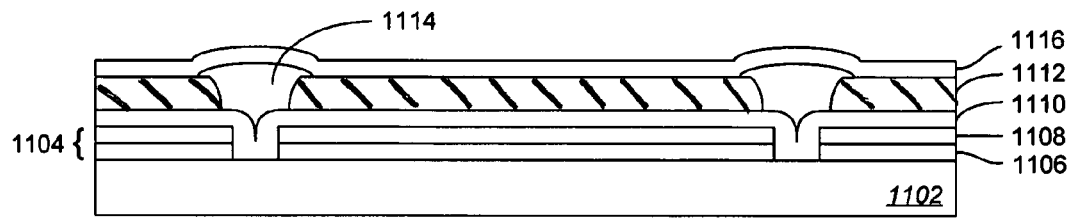
Figure 11G:
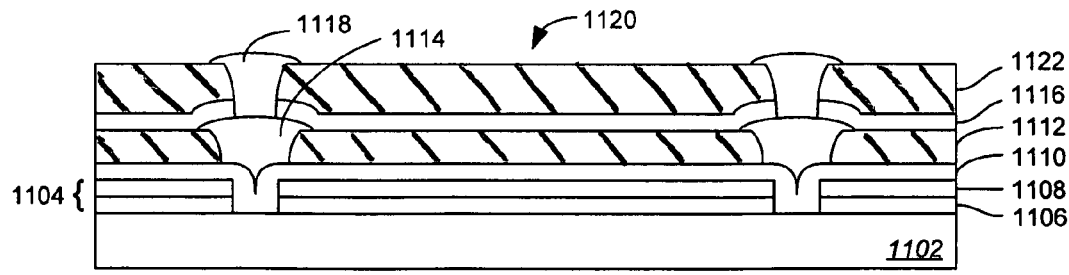
Figure 11H:
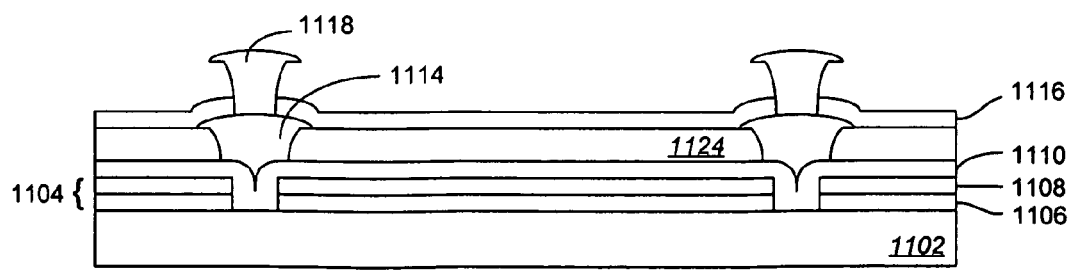

One or more second support posts are formed (step 1014). Referring to FIG. 11G, one or more second support posts 1118 are formed over the first support posts 1114. In one embodiment, the second support posts 1118 are formed after step 1012 by depositing another sacrificial layer 1122 on top of the second conductive plate 1116. Patterning and etching the sacrificial layer 1122 in locations selected for support posts 1118 will leave cavities in which the support posts 1118 are then formed in step 1014. In one embodiment the sacrificial layers 1112 and 1122 are released (etched) in one step. In one embodiment the sacrificial layers 1112 and 1122 are released in two stages, for example if the material comprising the sacrificial layers 1112 and 1122 are etchable only by different etchants. In one embodiment, one or more of the second support posts 1118 are operable to contact a backplate (not shown) when the backplate is deflected to protect the optical stack comprising the first conductive plate 1104 and the second conductive plate 1116. Although the example of FIG. 11F depicts the second support posts being formed only over the first support posts 1114, one or more second support posts can also be formed along the columns or rows of an interferometric modulator array (as represented by posts 804, 806 of FIG. 8). Additionally, one or more second support posts can be formed over an active area 1120 of the moveable reflective layer (as represented by posts 808 of FIG. 8). The sacrificial layer is etched (step 1016). As shown by FIG. 11G, the sacrificial layer 1112 is etched away from underneath the second conductive plate 1116, thus leaving (in one embodiment) an air gap 1124 between the first conductive plate 1104 and the second conductive plate 1116. Accordingly, the process 1000 can be implemented during the fabrication of an interferometric modulator (e.g., the interferometric modulators of FIGS. 6A-6E) to create one or more support posts operable to protect the interferometric modulator from damage due to, for example, deflection of a backplate.

Figure 12A:
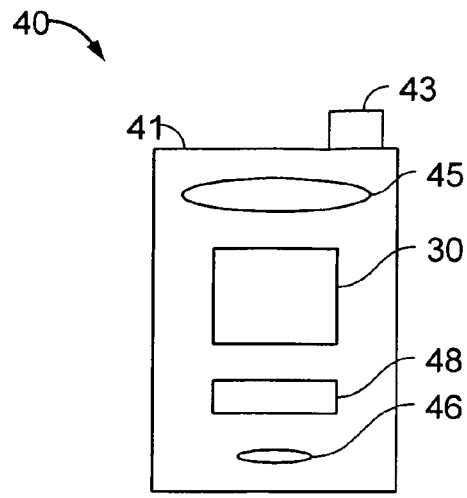
FIGS. 12A-12B are system block diagrams illustrating an embodiment of a visual display device comprising a plurality of interferometric modulators.
Figure 12B:
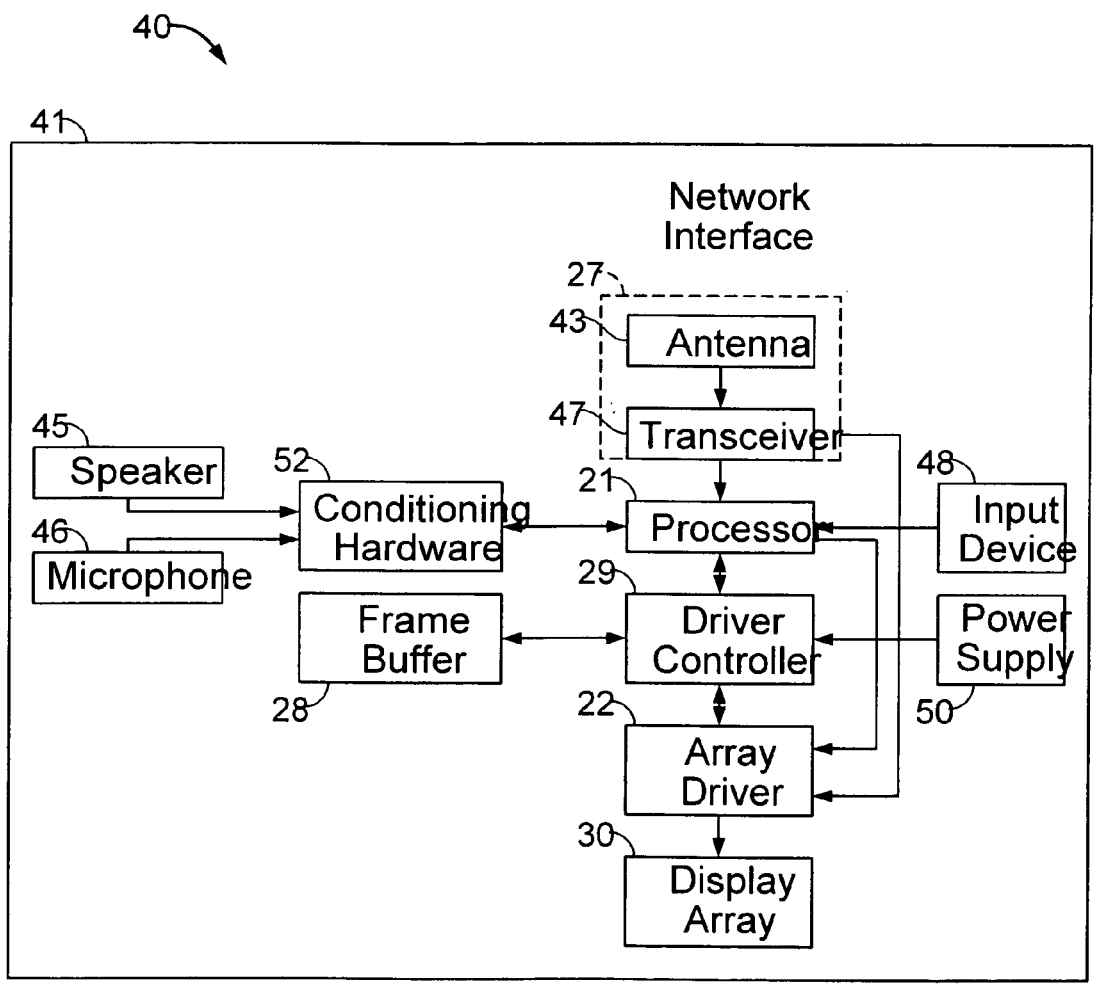

FIGS. 12A and 12B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 12B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display driver). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some embodiments control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Various embodiments of an interferometric modulator display have been described. Nevertheless, one or ordinary skill in the art will readily recognize that various modifications may be made to the implementations, and any variation would be within the spirit and scope of the present invention. For example, the process steps described above in connection with FIG. 10 may be performed in a different order and still achieve desirable results. Accordingly, many modifications may be made by one of ordinary skill in the art without departing from the spirit can scope of the following claims.

What is claimed is:

1. An interferometric modulator display comprising:
a substrate;
an array of interferometric modulators on the substrate, the interferometric modulators comprising:
an optical stack; and
a moveable reflective layer formed over the optical stack,
wherein the array comprises one or more first posts extending therefrom; and
a backplate attached to the substrate, the backplate comprising a recessed backplate including a non-recessed island formed therein, wherein the one or more first posts are operable to protect the moveable reflective layer by contacting the non-recessed island if the recessed backplate is deflected.

2. The interferometric modulator display of claim 1, wherein the non-recessed island is formed substantially in the center of the recessed backplate.

3. The interferometric modulator display of claim 1, further comprising one or more second non-recessed islands formed within the backplate, wherein the one or more first posts are further operable to protect the moveable reflective layer by contacting the one or more second non-recessed islands if the recessed backplate is deflected.

4. The interferometric modulator display of claim 1, wherein a top surface of the non-recessed island is substantially planar to an edge of the backplate that attaches to the substrate.

5. The interferometric modulator display of claim 1, further comprising desiccant dispensed on the backplate wound the non-recessed island, the desiccant to absorb moisture within the interferometric modulator display.

6. The interferometric modulator display of claim 1, wherein the one or more first posts have a circular cross-section.

7. The interferometric modulator display of claim 1, wherein the one or more first posts have a non-circular cross-section.

8. The interferometric modulator display of claim 1, further comprising: a processor that is in electrical communication with the interferometric modulator display, the processor being configured to process image data; and a memory device in electrical communication with the processor.

9. The interferometric modulator display of claim 8, further comprising:
a first controller configured to send at least one signal to the interferometric modulator display; and
a second controller configured to send at least a portion of the image data to the first controller.

10. The interferometric modulator display of claim 8, further comprising an image source module configured to send the image data to the processor.

11. The interferometric modulator display of claim 10, wherein the image source module comprises at least one of a receiver, transceiver, and transmitter.

12. The interferometric modulator display of claim 8, further comprising an input device configured to receive input data and to communicate the input data to the processor.

13. The interferometric modulator display of claim 1, wherein the substrate comprises glass.

14. The interferometric modulator display of claim 1, wherein the optical stack is partially transmissive.

15. The interferometric modulator display of claim 1, wherein the optical stack and the moveable reflective layer collectively form an interferometric cavity.

16. The interferometric modulator display of claim 1, wherein the moveable reflective layer comprises a mirror.

17. The interferometric modulator display of claim 1, wherein the backplate is substantially rigid.

18. An interferometric modulator display comprising:
a substrate means;
an array of means for interferometrically modulating light, the modulating means comprising:
an optical stack means; and
a moveable reflective layer means formed over the optical stack means,
wherein the array comprises one or more first post means extending therefrom; and
a recessed backplate means attached to the substrate means, the recessed backplate means including a non-recessed island means formed therein,
wherein the one or more first post means are operable to protect the moveable reflective layer means by contacting the non-recessed island means if the recessed backplate means is deflected.

19. The interferometric modulator display of claim 18, wherein the non-recessed island means is formed substantially in the center of the recessed backplate means.

20. The interferometric modulator display of claim 18, further comprising one or more second non-recessed island means formed within the backplate means, wherein the one or more first post means are further operable to protect the moveable reflective layer means by contacting the one or more second non-recessed island means if the recessed backplate means is deflected.

21. The interferometric modulator display of claim 18, wherein: the optical stack means is patterned into parallel strips that form rows of the interferometric modulator display; and wherein the one or more first post means extend from the optical stack means between the rows of the interferometric modulator display.

22. The interferometric modulator display of claim 21, the moveable reflective layer means comprising columns that are orthogonal to the parallel strips of the optical stack means, and wherein the one or more first post means extend from the moveable reflective layer means between the columns.

23. The interferometric modulator display of claim 18, wherein the substrate comprises glass.

24. The interferometric modulator display of claim 18, wherein the optical stack is partially transmissive.

25. The interferometric modulator display of claim 18, wherein the optical stack and the moveable reflective layer collectively form an interferometric cavity.

26. The interferometric modulator display of claim 18, wherein the moveable reflective layer comprises a mirror.

27. The interferometric modulator display of claim 18, wherein the backplate is substantially rigid.

* * * * *

UNITED STATES PATENT AND TRADEMARK OFFICE
CERTIFICATE OF CORRECTION

PATENT NO. : 7,561,334 B2  Page 1 of 1
APPLICATION NO. : 11/313436
DATED : July 14, 2009
INVENTOR(S) : Qi Luo It is certified that error appears in the above-identified patent and that said Letters Patent is hereby corrected as shown below:

On the Title Page, Item (57), Line 4 (Abstract), delete "including a".

At Column 6, Line 38, delete "0 volts." and insert, --10 volts.--.

At Column 9, Line 13, delete "750 ," and insert, --750,--.

At Column 11, Line 37, delete "764" " and insert, --764"'--.

At Column 16, Line 54, delete "wound" and insert, --around--.

Signed and Sealed this

Sixth Day of April, 2010

David J. Kappos
*Director of the United States Patent and Trademark Office*